United States Patent

Yamamoto et al.

[11] Patent Number: 5,818,150
[45] Date of Patent: Oct. 6, 1998

[54] FOUR-TERMINAL PIEZOELECTRIC CERAMIC TRANSFORMER

[75] Inventors: Mitsuru Yamamoto; Takeshi Inoue, both of Tokyo, Japan

[73] Assignee: NEC Corporation, Tokyo, Japan

[21] Appl. No.: 770,165

[22] Filed: Dec. 19, 1996

[30] Foreign Application Priority Data

Dec. 20, 1995 [JP] Japan ................................. 7-331978

[51] Int. Cl.⁶ .................................................. H01L 41/08
[52] U.S. Cl. ........................................... 310/359; 310/366
[58] Field of Search .................................. 310/358, 359, 310/366, 328

[56] References Cited

U.S. PATENT DOCUMENTS

| | | | |
|---|---|---|---|
| 5,365,141 | 11/1994 | Kawai et al. | 310/359 |
| 5,440,195 | 8/1995 | Ohnishi et al. | 310/359 |
| 5,463,266 | 10/1995 | Fukuoka et al. | 310/359 |
| 5,504,384 | 4/1996 | Lee et al. | 310/359 |
| 5,576,590 | 11/1996 | Ohnishi et al. | 310/359 |

FOREIGN PATENT DOCUMENTS

| | | | |
|---|---|---|---|
| 0079778 | 5/1983 | Japan | 310/359 |
| 63-272084 | 11/1988 | Japan | 310/359 |
| 428579 | 2/1975 | U.S.S.R. | 310/359 |

Primary Examiner—Mark O. Budd
Attorney, Agent, or Firm—Young & Thompson

[57] ABSTRACT

A generator section and a pair of drive sections are disposed along the lengthwise of a piezoelectric ceramic plate. The one pair of drive sections are disposed at both ends or at one end of the plate and have a pair of electrodes for each. The piezoelectric ceramic plate in the drive sections are polarized oppositely in direction and connected to a pair of external terminals. The generator section has two pairs of opposed electrodes which are polarized oppositely from the center along the lengthwise of the plate. The two pairs of opposed electrodes are respectively short-circuited and connected to external terminals. A voltage can be taken out from between the external terminals of the generator section at the vibration nodes when the piezoelectric ceramic plate in the drive section is vibrated by applying an AC voltage to between the input terminals on the drive section side at the resonance frequency of the fourth-order mode longitudinal vibration in lengthwise. This 4-terminal piezoelectric ceramic transformer has a high-voltage/high-reliability and is easy to handle in the design of a peripheral circuit.

13 Claims, 5 Drawing Sheets

FOUR-TERMINAL PIEZOELECTRIC CERAMIC TRANSFORMER

BACKGROUND OF THE INVENTION

1. Field of the Invention

The present invention relates to a small-sized and high-voltage, high-power piezoelectric ceramic transformer and more particularly to a four-terminal piezoelectric ceramic transformer with high reliability.

2. Description of the Prior Art

In the power supply circuit of a high-voltage requiring device, such as a deflection device for TV or a charged device for copiers, a wire-wound electromagnetic transformer has been used as the transforming element for high-voltage generation. The electromagnetic transformer is so structured that a conductor is wound around the core of a magnetic material, a greater number of conductor winding is required to achieve a high transformation ratio. Thus, it is very difficult to make a small-sized and slim-model electromagnetic transformer practicable.

For this purpose, a piezoelectric transformer using the piezoelectric effect is proposed as shown in FIG. 1. This is called Rosen-type piezoelectric transformer, in which a drive section 3 and a generator section 5 are provided on a piezoelectric ceramic plate 1. A low-impedance drive section 3 has a pair of electrodes 21 and 22 provided on the top and bottom faces and has been polarized in a direction of the thickness of the piezoelectric ceramic plate 1 as indicated with an arrow 11 in FIG. 1. On the other hand, a high-impedance generator section 5 has an electrode 4 provided on the end face and has been polarized in a longitudinal direction of the piezoelectric ceramic plate 1 as indicated with an arrow 12 in FIG. 1.

When an AC electric field is applied at the drive section 3 in its thickness direction by applying an AC voltage between a pair of driving electrodes 21 and 22 through a pair of external terminals 201 and 202, a longitudinal vibration in a direction of the length of the plate 1 due to a piezoelectric reverse effect (hereinafter, referred to as piezoelectric transverse effect mode), and the whole piezoelectric ceramic plate 1 vibrates.

In the generator section 5, due to a piezoelectric effect (hereinafter, referred to as piezoelectric longitudinal effect mode 33) that a mechanical distortion occurs along the polarization direction to generate a potential difference along the polarization direction, an AC voltage of the same frequency as that of the input voltage is taken out from an external terminal 401 through an output electrode 4. At that time, if the driving frequency is made equal to the resonance frequency of the piezoelectric ceramic plate, a very high output voltage is obtained. Incidentally, when allowing a low voltage to be output for a high voltage input, clearly, it is only necessary to set the high-impedance generator section 5 having a longitudinal effect to the input side and the low-impedance drive section 3 having a transverse effect to the output side.

This type of piezoelectric transformer is used in a resonance state and has numerous features in that (i) no winding structure is needed and the energy density is high, so that the downsizing and slim-modelling can be achieved; (ii) an inflammable structure can be achieved; and (iii) no electromagnetically induced noise is generated, etc. in comparison with a general electromagnetic transformer.

Because the electrode 4 of the generator section 5 is situated at the loop of a vibration generated in the piezoelectric ceramic plate, however, a conventional Rosen-type piezoelectric transformer shown in FIG. 1 is faulty in that the connection of the external terminal 401 badly affects the vibration of the piezoelectric ceramic plate, the reliability lowers greatly, etc.

In addition, it is fundamentally of 3-terminal arrangement having three electrodes 21, 22 and 4, and it is difficult to achieve a 4-terminal remodelling in which the input and output are separated in the circuit.

SUMMARY OF THE INVENTION

It is an object of the present invention to provide a piezoelectric ceramic transformer having a high-voltage/high-reliability characteristic in a 4-terminal arrangement easy to handle in the design of a peripheral circuit.

To attain the above object, a piezoelectric ceramic transformer according to the present invention comprises a pair of drive sections and a pair of generator sections and is so arranged as to be operated in a fourth-order lengthwise longitudinal vibration mode.

The piezoelectric ceramic plate is a piezoelectric vibration body of a square plate longer in lengthwise.

The pair of drive sections have two pairs of first electrodes provided opposite the thickness-directed end faces of the piezoelectric ceramic plate and the pair of generator sections have two pairs of second electrodes provided opposite the thickness-directed end faces of the piezoelectric ceramic plate.

The piezoelectric ceramic plate in the drive sections is polarized in its thickness direction by an electric field applied between the first electrodes, whereas the piezoelectric ceramic plate in the generator sections is polarized in a longitudinal direction but in a direction opposite to each other, bordered by a pair of polarizing electrodes provided in the middle position of the two pairs of second electrodes.

When two pairs of first electrodes in the drive sections are separated and disposed across the pair of generator sections in the ends of the piezoelectric ceramic plate, the polarization directions in the drive sections are made opposite to each other.

When a pair of drive sections and a pair of generator sections are separated and provided to the right and to the left, bordered by the center in the length of the piezoelectric ceramic plate, the polarization directions under two pairs of first electrodes in the drive sections are made opposite to each other.

Alternatively, when the drive sections and the generator sections are separated and provided to the right and to the left, bordered by the center in the length of the piezoelectric ceramic plate and the one side of electrodes out of the two pairs of first electrodes in the drive sections are made a common electrode, the polarization directions in a pair of drive sections are made one and the same.

Meanwhile, the length of the first electrodes in the drive sections is set at a quarter of the total length of the piezoelectric ceramic plate, the second electrodes in the generator sections are disposed to the right and to the left across the polarizing electrodes in the center and provided within the range of a quarter of the total length of the piezoelectric ceramic plate and the gap between the adjacent electrodes of the drive and generator sections is set at one eighth of the total length of the piezoelectric ceramic plate.

According to the present invention, the piezoelectric ceramic plate is vibrated in the fourth order mode in the length direction and the electrodes are provided at the respective nodes of the vibration, a four-terminal arrangement can be implemented.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
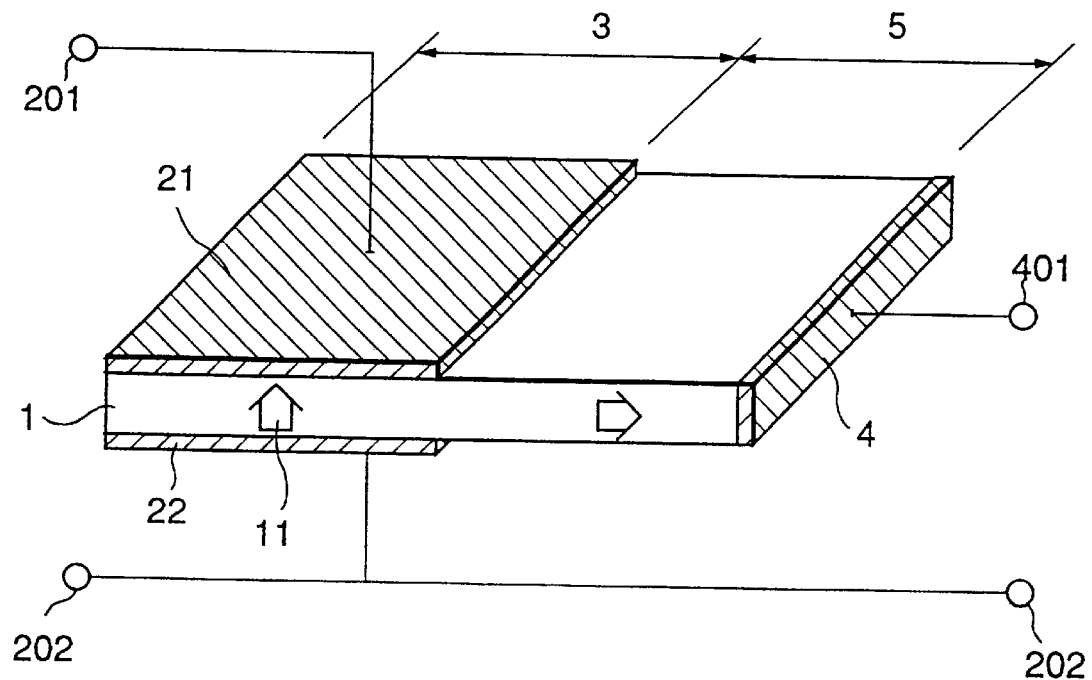
FIG. 1 is a perspective view showing a conventional Rosen-type piezoelectric transformer.
Figure 2A:
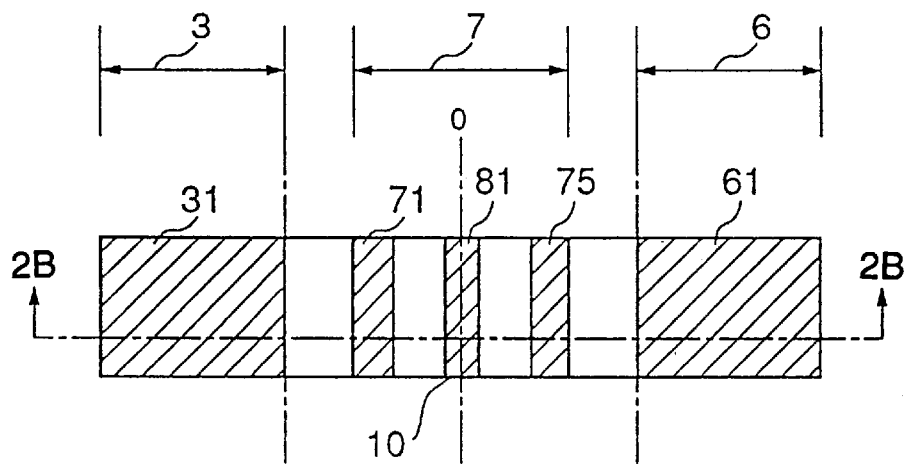
FIG. 2A is a plan view showing a piezoelectric ceramic transformer according to a first embodiment of the present invention.

As shown in FIG. 2, a piezoelectric ceramic transformer according to a first embodiment of the present invention comprises a first drive section 3 and a second drive section 6 disposed on both sides in the length of a piezoelectric ceramic plate 10, and a generator section 7 disposed between both drive sections 3 and 6. The first drive section 3 has a top electrode 31 and a bottom electrode 32 disposed oppositely on the top and bottom faces of one end of the piezoelectric ceramic plate 10. The second drive section 6 has a top electrode 61 and a bottom electrode 62 disposed oppositely on the top and bottom faces of another end of the piezoelectric ceramic plate 10.

Figure 2B:
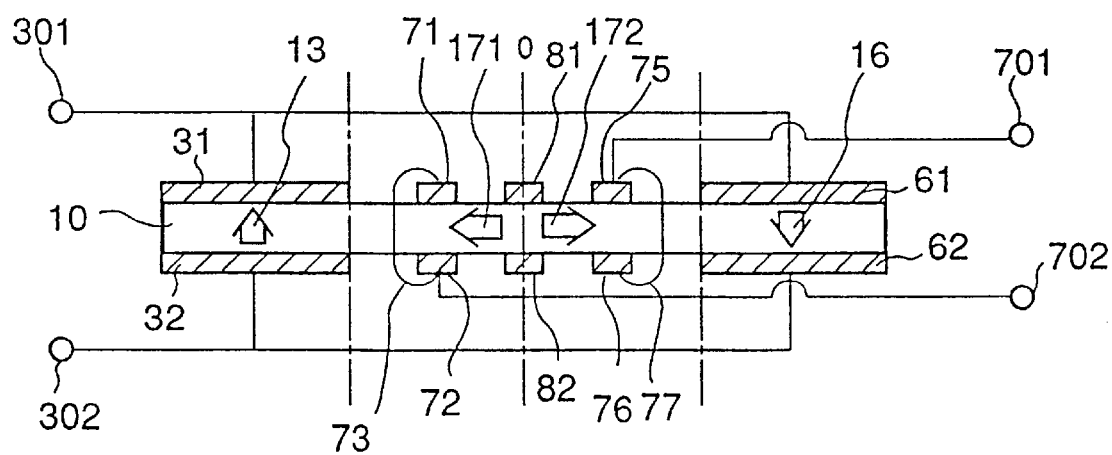
FIG. 2B is a sectional view taken along a line A—A of FIG. 2A.

The generator section 7 is disposed at the center of the piezoelectric ceramic plate 10 and three pairs of stripe-shaped electrodes are disposed oppositely across the piezoelectric ceramic plate 10 as shown in FIG. 2B. That is, the top electrode 71 and bottom electrode 72 are used as first electrodes for power generation, the top electrode 75 and bottom electrode 76 are used as second electrodes for power generation and the top electrode 81 and bottom electrode 82 opposed at the center are used as electrodes for polarization.

Two pairs of electrodes 31, 32, 61 and 62 in the first and second drive sections are formed in a symmetrical manner to the center 0 in lengthwise on both sides of the piezoelectric ceramic plate 10. Between these two pairs of electrodes for drive sections, the generator section 7 is disposed, while the electrodes 81 and 82 for polarization are disposed at the position of the center 0, on both sides of which two pairs of electrodes for power generation 71, 72, 75 and 76 are disposed.

The respective length of the electrodes 31, 32, 61 and 62 of the first and second drive sections 3 and 6 in the lengthwise of the piezoelectric ceramic plate 10 is set at a quarter of the overall length of the piezoelectric ceramic plate 10. In addition, to the top electrodes 31 and 61 on both sides, an external terminal 301 is electrically connected, whereas an external terminal 302 is electrically connected to the bottom electrodes 32 and 62 on both sides. These external terminals 301 and 302 are led from near the middle point in the respective whole length of individual electrodes 31, 32, 61 and 62.

Furthermore, the respective polarization directions of the piezoelectric ceramic plate 10 in the first and second drive sections 3 and 6 are opposite to each other in thickness direction which are determined by a direction of electric fields applied between the respective opposed electrodes. With the example of FIG. 2B, the piezoelectric ceramic plate 10 has been polarized upward as indicated with the arrow 13 in the first drive section 3 and downward as indicated with the arrow 16 in the second drive section 6.

And in the generator section 7, the generating electrodes 71, 72, and 75, 76 are disposed at a distance of one eighth of the overall length of the piezoelectric ceramic plate 10 from the polarizing electrodes 81 and 82 disposed at the center 0 of the piezoelectric ceramic plate 10 to the left and to the right. To the electrodes 71 and 72, an external terminal 702 is connected, respectively, whereas an external terminal 701 is connected to the electrodes 75 and 76, respectively. At this time, a pair of electrodes 71 and 72 and another pair of electrodes 75 and 76 are short-circuited via a wire 73 and via a wire 77, respectively, and consequently are respectively made equal in potential.

On the other hand, by using the polarizing electrodes 81 and 82, the piezoelectric ceramic plate 10 in the generator section 7 is polarized in outward opposite directions to each other side (directions indicated the arrows 171 and 172) from the center 0 of the piezoelectric ceramic plate 10 along the length, but may be polarized in inward opposite directions.

Furthermore, the adjacent portion between the electrodes 31 and 32 of the first drive section 3 and the electrodes 71 and 72 of the generator section 7, and the adjacent portion between the electrodes 61 and 62 of the second drive section 6 and the electrodes 75 and 76 of the generator section 7 is kept at a distance of one eighth of the overall length of the piezoelectric ceramic plate 10, while these portions of the piezoelectric ceramic plate 10 are unpolarized and act as gaps for insulating the first and second drive sections 3 and 6, and the generator section 7. In addition, the polarizing electrodes 81 and 82 are used only in polarizing the generator section 7 and not related to the drive of the piezoelectric ceramic transformer, and may be removed after the polarization.

In FIG. 2, when an AC voltage of a frequency near the resonance frequency of the fourth-order mode longitudinal vibration in lengthwise is applied to between the external terminals 301 and 302 of the drive sections 3 and 6, the fourth-order mode longitudinal vibration in lengthwise is generated due to a piezoelectric transverse effect 31 mode with the electromechanical coupling coefficient $k_{31}$ on the piezoelectric ceramic plate 10 in the drive sections 3 and 6. This longitudinal vibration of the piezoelectric ceramic plate 10 propagates to the piezoelectric ceramic plate 10 due to a the generator section 7, and a voltage is taken out in the piezoelectric longitudinal effect 33 mode with the electromechanical coupling coefficient $k_{33}$ between the external terminals 701 and 702.

FIG. 3 shows a part of the displacement chart of fourth-order mode longitudinal vibration in lengthwise at that time.

Figure 3A:
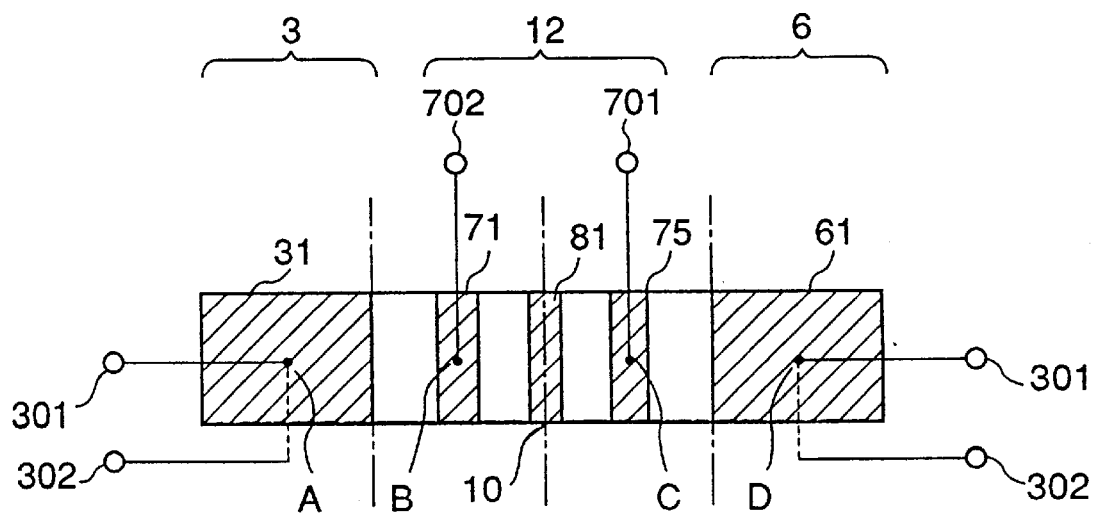
FIG. 3A and FIG. 3B are a plan view and a characteristic chart for illustrating the displacement distribution of the piezoelectric ceramic transformer shown in FIG. 2.
Figure 3B:
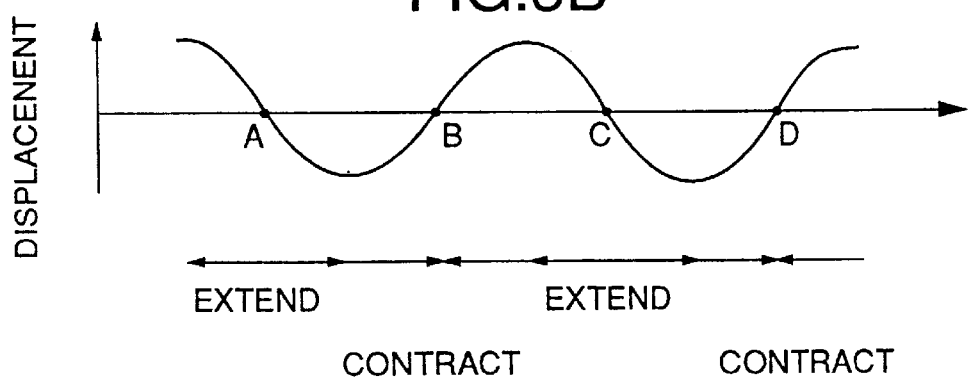

As clear from FIG. 3A, the takeout positions of the external terminals 301, 302, 701 and 702 coincide with the nodes A, B, C, and D of the vibration as shown in FIG. 3B. Accordingly, such a problem as the effect of the external terminals on the vibration or inversely the peeling of the external terminals due to the vibration is eliminated and a high reliability can be achieved. In addition, the actualized four-terminal remodelling allows the input and output to be completely separated through the DC insulation, thereby facilitating the design of peripheral circuits such as the control circuit of a piezoelectric ceramic transformer.

Next, a piezoelectric ceramic transformer according to a second embodiment of the present invention will be described referring to FIG. 4. Two pairs of electrodes 31, 32, 61 and 62 in the drive sections 36 of the piezoelectric ceramic transformer are gathered and provided on either side from the center 0 of a piezoelectric ceramic plate 10 to the right or left (to the left in FIG. 4) and the respective length of individual electrodes 31, 32, 61 and 62 is set at a quarter of the overall length of the piezoelectric ceramic plate 10. In addition, to the top electrodes 31 and 61, an external terminal 301 is connected, whereas an external terminal 302 is attached to the bottom electrodes 32 and 62. The external terminals 301 and 302 are led from near the middle point of the whole extent of individual electrodes 31, 32, 61 and 62.

On the other hand, two pairs of electrodes 71, 72, 75 and 76 and the polarizing electrodes 81 and 82 in the generator section 70 are gathered and provided on either side from the center 0 of a piezoelectric ceramic plate 10 to the right or left (to the right in FIG. 4) and the generating electrodes 71, 72, 75 and 76 are disposed at a distance of one eighth of the overall length of the piezoelectric ceramic plate 10 to the right and to the left from the polarizing electrodes 81 and 82. To the electrodes 71 and 72, an external terminal 701 is connected, whereas an external terminal 702 is connected to the electrodes 75 and 76. At this time, the electrodes 71 and 72 and the electrodes 75 and 76 are short-circuited via a wire 73 and via a wire 77 and made equal in potential respectively.

In addition, the piezoelectric ceramic plate 10 in the drive sections 36 is polarized oppositely in direction (directions indicated by the arrows 13 and 16) by the respective electric fields generated between the electrodes 31 and 32 and the electrodes 61 and 62. If both directions are opposite, it presents no problem whether either polarization direction is upward or downward.

By using the polarizing electrodes 81 and 82, the piezoelectric ceramic plate 10 in the generator sections 70 is polarized oppositely in lengthwise (directions of the arrows 171 and 172 in FIG. 4) to the right and left from the center 0 of the piezoelectric ceramic plate 10. These polarization directions also may be inwardly opposed, as opposite to those shown in FIG. 4.

Furthermore, the adjacent portion between the electrodes 61 and 62 of the drive section 36 and the electrodes 71 and 72 of the generator section 70 is kept at a distance of one eighth of the overall length of the piezoelectric ceramic plate 10, while these portions of the piezoelectric ceramic plate 10 are unpolarized and act as gaps for insulating the drive section 36 and the generator section 70. In addition, the polarizing electrodes 81 and 82 are used only in polarizing the generator section 7 and not related to the drive of the piezoelectric ceramic transformer.

Figure 4A:
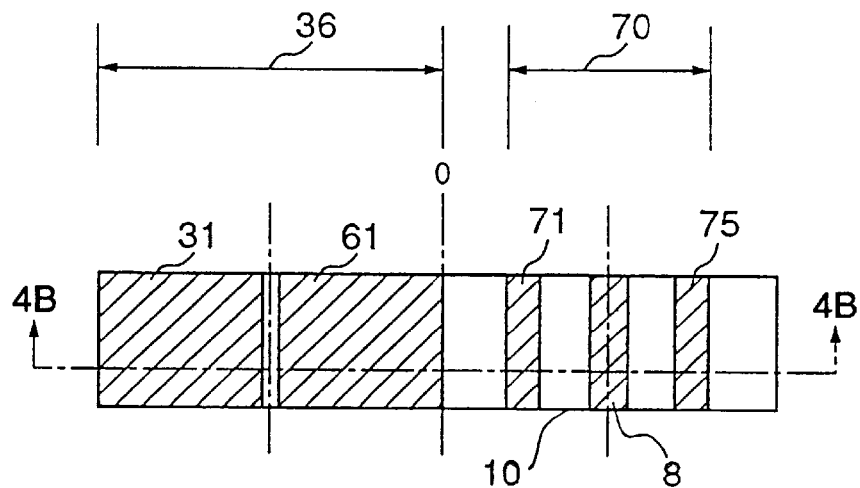
FIG. 4A is a plan view showing a piezoelectric ceramic transformer according to a second embodiment of the present invention.
Figure 4B:
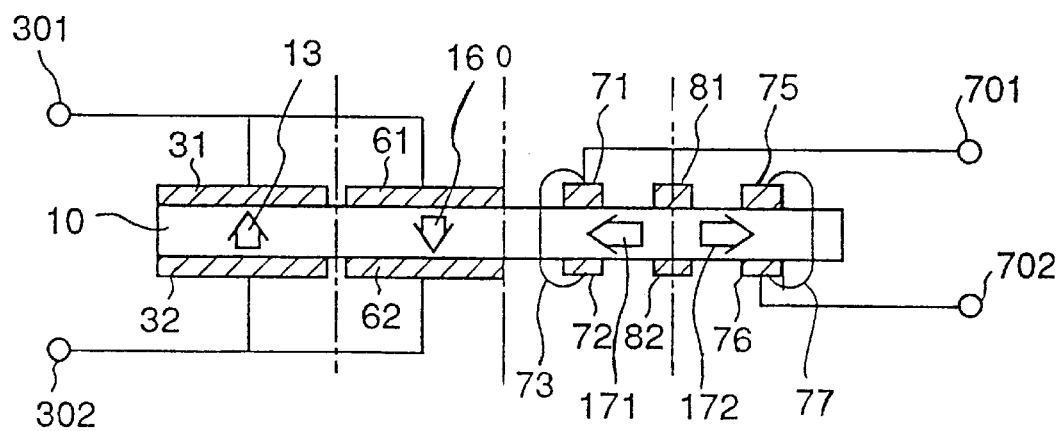
FIG. 4B is a sectional view taken along a line B—B of FIG. 4A.

In FIG. 4, when an AC voltage of a frequency near the resonance frequency of the fourth-order mode longitudinal vibration in lengthwise is applied to between the external terminals 301 and 302 of the drive section 36, the fourth-order mode longitudinal vibration in lengthwise is generated due to a piezoelectric transverse effect 31 mode with the electromechanical coupling coefficient $k_{31}$ on the piezoelectric ceramic plate 10 in the drive section 36. This longitudinal vibration of the piezoelectric ceramic plate 10 propagates to the piezoelectric ceramic plate 10 in the generator section 70, and a voltage is taken out due to a piezoelectric longitudinal effect 33 mode with the electro-mechanical coupling coefficient $k_{33}$ between the external terminals 701 and 702. The displacement chart of fourth-order mode longitudinal vibration in lengthwise at this time becomes similar to that of FIG. 3, seen in the piezoelectric ceramic transformer having the structure of FIG. 2 and the characteristics are also as mentioned above.

Figure 5A:
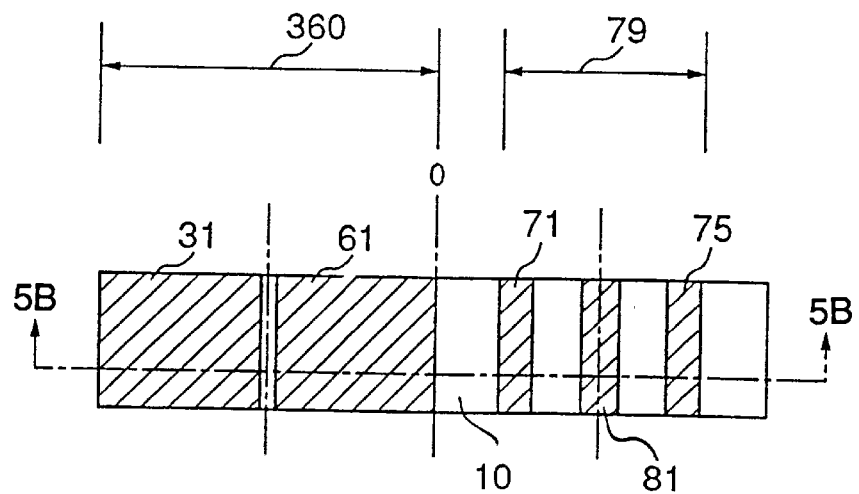
FIG. 5A is a plan view showing a piezoelectric ceramic transformer according to a third embodiment of the present invention.
Figure 5B:
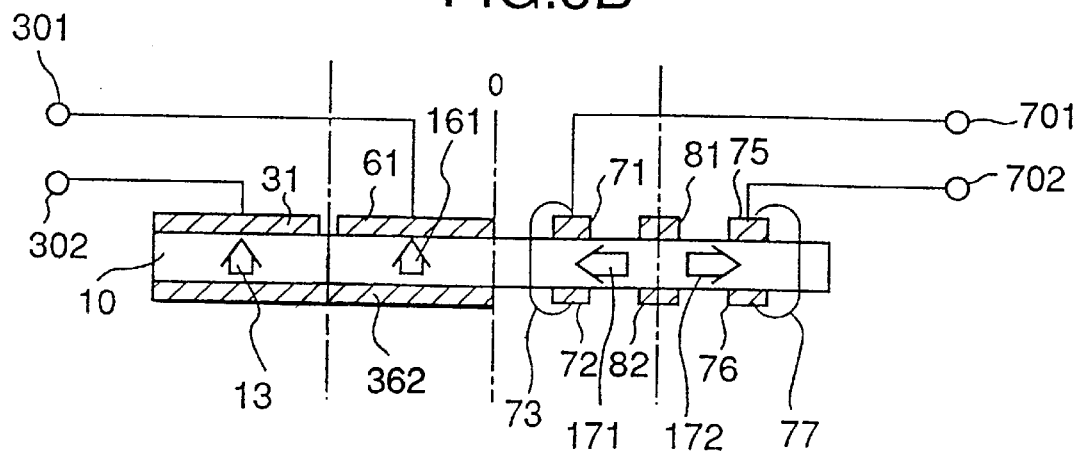
FIG. 5B is a sectional view taken along a line C—C of FIG. 5A.

Next, a piezoelectric ceramic transformer according to a third embodiment of the present invention will be described referring to FIGS. 5A and 5B. This piezoelectric ceramic transformer is one in which the drive section 36 shown in FIG. 4 is simplified. That is, among the electrodes 31, 61 and 362 in the drive section 360, the bottom electrode 362 disposed on the lower left face of a piezoelectric ceramic plate 10 is arranged as a structure united by the short-circuiting of bottom electrodes 32 and 62 in FIG. 4. The top electrodes 61 and 31 on the upper left face of the piezoelectric ceramic plate 10 are separately arranged and external terminals 301 and 302 are connected to the electrodes 61 and 31, respectively.

The piezoelectric ceramic plate 10 between the top electrodes 31 and 61 and the bottom electrode 362 in this embodiment is polarized in the same direction as with each other (directions of the arrows 13 and 161 in FIG. 5B) in the thickness of the piezoelectric ceramic plate 10. On the other hand, the polarization directions of the generator section 79 are the same as with the structure of FIG. 4 (directions of the arrows 171 and 172 in FIG. 5B).

This embodiment has an advantage in that the external input and output terminals can be connected in the same face as shown in FIG. 5. Also, the number of lead wires for the external terminals decreases and the reliability can be promoted.

The displacement chart of fourth-order mode longitudinal vibration in lengthwise for this embodiment becomes similar to FIG. 3 shown for the piezoelectric ceramic transformer having the structure of FIG. 2 and the characteristics are also as mentioned above.

Incidentally, in the piezoelectric ceramic transformers described above, any piezoelectric ceramic plate comprises a single piezoelectric ceramic layer, but a piezoelectric ceramic transformer making it a purpose to obtain a higher boost ratio by the lamination or multilayer of the drive section in a piezoelectric ceramic transformer according to the present invention with the aid of lamination or multilayer ceramic technique using green sheet process is also included within the scope of the present invention.

Hereinafter, a case of preparing a piezoelectric ceramic transformer composed as shown in FIG. 2 will be described as Concrete Example 1 of piezoelectric ceramic transformer according to the present invention. A PZT ($PbZrO_3$—$PbTiO_3$) piezoelectric ceramic plate was used for the material of a piezoelectric ceramic plate 10. The size of the piezoelectric ceramic plate 10 is 48 mm long, 10 mm wide and 1 mm thick. By screen printing and baking an Ag paste onto both end faces in thickness of the piezoelectric ceramic plate 10, four pairs of electrodes 31 and 32, 61 and 62, 71 and 72, 75 and 76 and polarizing electrodes 81 and 82 are formed. The electrodes 31 and 32 and 61 and 62 of the drive sections 3 and 6 are set at a size of 12 mm in length and 8 mm in width and formed with a margin of 1 mm left on both ends in length of the piezoelectric ceramic plate 10, whereas the electrodes 71 and 72 and 75 and 76 of the generator sections 7 and polarizing electrodes 81 and 82 are set at a size of 2 mm in length along the longitudinal direction of the plate 10 and 8 mm in a direction of the width of the plate 10 and formed with a margin of 1 mm left at the center and the positions of distance on eighth of the overall length of the piezoelectric ceramic plate 10, i.e., 6 mm from the center 0 of the piezoelectric ceramic plate 10 to the right and to the left. These electrodes may be formed by means other than the coating/baking, for example, by using the vacuum deposition or sputtering as films of conductor materials other than Ag.

Then, lead wires were temporarily connected to individual electrodes by soldering and both the drive and generator sections were subjected to polarization treatment in an insulator oil at 170° C. under application of 2 kV/mm DC voltage. For the drive sections, polarization proceeded with the lead wires connected to the electrodes 32 and 61 being connected to an anode side and the lead wires connected to the electrodes 31 and 62 being connected to a cathode side of the polarization terminals. Next, for the generator sections, polarization proceeded with the lead wires connected to the electrodes 71, 72, 75 and 76 being connected to the cathode side and the lead wires connected to the polarizing electrodes 81 and 82 being connected to the anode side of the polarization terminals.

After the polarization, all temporarily connected lead wires were removed once and the lead wires were connected again by using a solder to attach four external terminals 301, 302, 701 and 702. At that time, the connection positions of a solder were selected at those of one eighth, three eighths, five eighths and seven eighths of the overall length (6 mm, 18 mm, 30 mm and 36 mm, respectively) distant from one end of the piezoelectric ceramic plate.

The resonance frequency of fourth-order mode longitudinal vibration in lengthwise of this piezoelectric ceramic transformer was measured to be 138 kHz from the admittance frequency characteristic. A connection of a load resistance of 100 kΩ to this piezoelectric ceramic transformer yielded an output voltage of 520 V and output power of 3.2 W for an input voltage of 10 V.

In addition, 100 piezoelectric ceramic transformers according to this concrete example were driven for 2000 hr, but no disorder such as peeling of an external terminal was observed.

As Concrete Example 2 of piezoelectric ceramic transformer according to the present invention, the case of preparing a piezoelectric ceramic transformer composed as shown in FIG. 4 will be described. A PZT (PbZrO$_3$—PbTiO$_3$) piezoelectric ceramic plate was used for the material of a piezoelectric ceramic plate 10 as with that mentioned in Concrete Example 1, whose size is 48 mm long, 10 mm wide and 1 mm thick. The electrodes 31 and 32 and 61 and 62 of the drive sections 36 are set at a size of 11 mm in length and 8 mm in width and formed with a margin of 1 mm left between different pairs and a margin of 1 mm at the outer edge on a half side from the center 0 of the piezoelectric ceramic plate 10, whereas the electrodes 71 and 72 and 75 and 76 of the generator section 70 and the polarizing electrodes 81 and 82 are set at a size of 2 mm in length and 8 mm in width and formed at the positions of distance on eighth of the overall length of the piezoelectric ceramic plate 10, i.e., 6 mm from the center 0 on the other half side of the piezoelectric ceramic plate to the right and to the left and a margin of 1 mm left at the center and the outer edge.

Then, lead wires were temporarily connected to individual electrodes by soldering and both the drive and generator sections were subjected to polarization treatment in an insulator oil at 170° C. under application of 2 kV/mm voltage. For the drive section 36, polarization proceeded with the lead wires connected to the electrodes 32 and 61 being connected to an anode side and the lead wires connected to the electrodes 31 and 62 being connected to a cathode side of the polarization terminals.

Next, for the generator section 70, polarization proceeded with the lead wires connected to the electrodes 71, 72, 75 and 76 being connected to the cathode side and the lead wires connected to the polarizing electrodes 81 and 82 being connected to the anode side of the polarization terminals. After the polarization, all temporarily connected lead wires were removed once and the lead wires were connected again by using a solder to attach four external terminals 301, 302, 701 and 702. At that time, the connection positions of a solder were selected at those of one eighth, three eighths, five eighths and seven eighths of the overall length (6 mm, 18 mm, 30 mm and 36 mm, respectively) distant from one end of the piezoelectric ceramic plate.

The resonance frequency of fourth-order mode longitudinal vibration in lengthwise of this piezoelectric ceramic transformer was measured to be 142 kHz from the admittance frequency characteristic. A connection of a load resistance of 100 kΩ to this piezoelectric ceramic transformer yielded an output voltage of 570 V and output power of 3.4 W for an input voltage of 10 V.

In addition, 100 piezoelectric ceramic transformers according to this concrete example were driven for 2000 hr, but no disorder such as peeling of an external terminal was observed.

As Concrete Example 3 of piezoelectric ceramic transformer according to the present invention, the case of preparing a piezoelectric ceramic transformer composed as shown in FIG. 5 will be described. As with Concrete Examples 1 and 2, the piezoelectric ceramic plate 10 was made up of a PZT (PbZrO$_3$—PbTiO$_3$) piezoelectric ceramic plate and set at size of 48 mm in length, 10 mm in width and 1 mm in thickness. The sizes and positions of electrodes 71 and 72 and 75 and 76 of the generator section 79 are similar to those of Concrete Example 2. With respect to the electrodes 31, 61 and 362 of the drive section 360, the bottom electrodes 32 and 62 are short-circuited and so formed as to become one and the same electrode 362 in contrast to Concrete Example 2, and the top electrodes 31 and 61 are equal in size and set at a size of 24 mm in length and 8 mm in width.

Then, lead wires were temporarily connected to individual electrodes by soldering and both the drive section 360 and generator section 79 were subjected to polarization treatment in an insulator oil at 170° C. under application of 2 kV/mm voltage. For the drive section 360, polarization proceeded with the lead wires connected to the electrodes 31 and 61 being connected to a cathode side and the lead wires connected to the bottom electrode 362 being connected to an anode side of the polarization terminals.

Next, for the generator section 79, polarization proceeded with the lead wires connected to the electrodes 71, 72, 75 and 76 being connected to the anode side and the lead wires connected to the polarizing electrodes 81 and 82 being connected to the cathode side of the polarization terminals.

After the polarization, all temporarily connected lead wires were removed once and the lead wires were connected again by using a solder to attach four external terminals 301, 302, 701 and 702. At that time, the connection positions of a solder were selected at those of one eighth, three eighths, five eighths and seven eighths of the overall length (6 mm, 18 mm, 30 mm and 36 mm, respectively) distant from one end of the piezoelectric ceramic plate and the lead wires were all taken out only from the main face on one side of the piezoelectric ceramic plate 10.

The resonance frequency of fourth-order mode longitudinal vibration in lengthwise of this piezoelectric ceramic transformer was measured to be 140 kHz from the admittance frequency characteristic. A connection of a load resistance of 100 kΩ to this piezoelectric ceramic transformer yielded an output voltage of 480 V and output power of 2.8 W for an input voltage of 10 V.

In addition, 100 piezoelectric ceramic transformers according to this concrete example were driven for 2000 hr, but no disorder such as peeling of an external terminal was observed.

As mentioned above, piezoelectric ceramic transformers according to the present invention can be four-terminal arrangements, can be characteristic of high voltage/high power/high reliability and can be made small-sized/slim-modelled, so that an industrial value can be increased.

Furthermore, the disposition of drive sections and generator sections can be variously modified and changed, and some degrees of freedom can be attached to the design of a peripheral circuit incorporating a piezoelectric ceramic transformer.

What is claimed is:

1. A piezoelectric transformer comprising:
a piezoelectric plate in the form of an elongated plate,
said piezoelectric plate having at least one driver section and a generator section,
said driver section being polarized in a thickness direction of said plate,
said generator section being polarized in a longitudinal direction of said plate,
a pair of input terminals connected to electrodes associated with said driver section,
a pair of output terminals connected to electrodes associated with said generator section,
both of said output terminals being electrically isolated from said input terminals, and
all of said electrodes connected to said terminals being located at nodes of a fourth-order mode longitudinal vibration, wherein said generator section further has a pair of opposed electrodes other than said electrode associated with said generator section to provide two generator subsections polarized in said longitudinal direction but in a direction opposite to each other.

2. The piezoelectric transformer according to claim 1, wherein a region between said driver sections and said generator section is unpolarized and act as gaps for insulating therebetween.

3. The piezoelectric transformer according to claim 2, wherein said region between said driver sections and said generator section is kept at a distance of one eighth of an overall length of said plate.

4. The piezoelectric transformer according to claim 2, wherein each of said generator subsections has a length of a quarter of said overall length.

5. The piezoelectric transformer according to claim 1, wherein
said generator subsections are disposed at a center of said plate in its longitudinal direction,
said driver sections are separated and disposed on both sides of said generator section.

6. The piezoelectric ceramic transformer according to claim 1, wherein said generator subsections are disposed at one side of said plate while said driver sections are disposed at the other side of said plate.

7. A piezoelectric transformer comprising:
an elongated piezoelectric plate having top and bottom surfaces,
first top and bottom electrodes provided on said top and bottom surfaces, respectively, so as to be opposed to each other,
said plate between said first top and bottom electrodes being polarized in a thickness direction thereof to provide a first driver section,
second top and bottom electrodes provided on said top and bottom surfaces, respectively, so as to be opposed to each other,
said plate between said second top and bottom electrodes being polarized in a thickness direction thereof to provide a second driver section,
third top and bottom electrodes provided on said top and bottom surfaces, respectively, so as to be opposed to each other,
said third top and bottom electrodes being electrically connected to each other,
fourth top and bottom electrodes provided on said top and bottom surfaces, respectively,
said fourth top and bottom electrodes being electrically connected to each other,
fifth top and bottom electrodes provided on said top and bottom surfaces, respectively, and being located between said third top and bottom electrodes and said fourth top and bottom electrodes,
said plate between said third and fifth electrodes being polarized in a first longitudinal direction thereof to provide a first generator section,
said plate between said fourth and fifth electrodes being polarized in a second longitudinal direction opposite to said first longitudinal direction to provide a second generator section,
a first terminal electrically connected to one of said first top and bottom electrodes and one of said second top and bottom electrodes,
a second terminal electrically connected to the other of said first top and bottom electrodes and the other of said second top and bottom electrodes,
a third terminal electrically connected to said third top and bottom electrodes,
a fourth terminal electrically connected to said fourth top and bottom electrodes,
said first, second, third and fourth terminals being attached to associated electrodes at nodes of a fourth-order mode longitudinal vibration.

8. The piezoelectric transformer according to claim 7, wherein each of said first top and bottom electrodes and said second top and bottom electrodes has a length of a quarter of an overall length of said plate in a longitudinal direction.

9. The piezoelectric transformer according to claim 8, wherein a distance between said first top electrode and a central position of said third top electrode close to said first top electrode is one eighth of said overall length of said plate.

10. The piezoelectric transformer according to claim 7, wherein said first top and bottom electrodes are disposed at a left side of said plate in its longitudinal direction, said second top and bottom electrodes are disposed at a right side of said plate, said fifth top and bottom electrodes are disposed at a central position of said plate, said third top and bottom electrodes are disposed between said first and fifth top and bottom electrodes, and said fourth top and bottom electrodes are disposed between said second and fifth top and bottom electrodes.

11. The piezoelectric transformer according to claim 7, wherein said first electrodes are disposed at a left side of said plate in its longitudinal direction, said fourth electrodes are disposed at right side of said plate, said second electrodes are disposed adjacent to said first electrodes between said first electrodes and said fourth electrodes, said fifth electrodes are disposed adjacent to said fourth electrodes between said fourth electrodes and said second electrodes, said third electrodes are disposed between said second electrodes and said fifth electrodes.

12. The piezoelectric transformer according to claim 11, wherein said first bottom electrode and said second bottom electrode are short-circuited.

13. The piezoelectric transformer according to claim 7, wherein each of said four terminals is attached to its associated electrode centrally thereof.

* * * * *